United States Patent [19]

Bormann

[11] 4,048,629

[45] Sept. 13, 1977

[54] LOW POWER MOS RAM ADDRESS DECODE CIRCUIT

[75] Inventor: Alan Richard Bormann, Tempe, Ariz.

[73] Assignee: Motorola, Inc., Schaumburg, Ill.

[21] Appl. No.: 609,854

[22] Filed: Sept. 2, 1975

[51] Int. Cl.² .................... H03K 19/34; G11C 11/34
[52] U.S. Cl. ........................... 340/173 CA; 307/215; 340/173 R
[58] Field of Search ........ 340/173 CA, 173 R, 147 C; 307/205, 251, 207, 215

[56] References Cited

U.S. PATENT DOCUMENTS 3,747,076  7/1973  Martino, Jr. ................. 340/173 CA Primary Examiner—Marshall M. Curtis
Attorney, Agent, or Firm—Charles R. Hoffman

[57] ABSTRACT

An MOS random access memory chip utilizes a column decode circuit scheme in which a signal derived from a chip select input of the random access memory chip is coupled to the gate of a switching device of dynamic IGFET NOR gates utilized to accomplish the column decoding function. This prevents the bit sense column selection conductor from being affected when an internal column selection clock signal is generated. This results in a substantial savings in power dissipation which would be required if it were necessary to provide circuitry to disable the internal column selection clock generator circuit during an unselected memory cycle.

2 Claims, 3 Drawing Figures

LOW POWER MOS RAM ADDRESS DECODE CIRCUIT

BACKGROUND OF THE INVENTION

1. Field of the Invention

The invention relates to MOS random access memory circuits and more particularly, to low power decoding and selection circuitry for random access memory circuits.

2. Description of the Prior Art

IGFET circuits have been widely utilized in the implementation of semiconductor random access memories (RAMs). A common problem in the implementation of IGFET integrated circuit devices, including RAMs, has been that of excessive power dissipation when the circuitry is designed for maximum operating speed. It is common practice, in a memory system implemented utilizing suitably packaged IGFET random access memory chips, to connect data output conductors of a rather large number of such RAM chips to a common data conductor. However, during operation of the memory system only one of the RAM chips connected to the common data conductor may be selected to communicate with the data conductor. The rest of the RAM chips so connected must be unselected, so that their data output conductors present a high impedance to the rest of the RAM chips. Typically, NOR decode gates are utilized in the RAM chips to provide the column decoding and row decoding functions required for a rectangular array or storage cells in each RAM chip. The NOR decode gates drive selection circuitry which may be implemented in a variety of ways. Regardless of how the selection circuitry is implemented, some sort of technique is required to disable the data output conductor during an unselected memory cycle. Some known schemes may disable the data output and input driver circuits, while other schemes disable the output of the selection circuits.

SUMMARY OF THE INVENTION

It is an object of this invention to provide a circuit technique for reducing decoding power dissipation of a random access memory chip during an unselected memory cycle.

Briefly described, the invention is a decode circuit in a random access memory circuit including chip selection circuitry coupled to decode gates for disabling the outputs of the decode gates during an unselected memory cycle.

DESCRIPTION OF THE INVENTION

Figure 1:
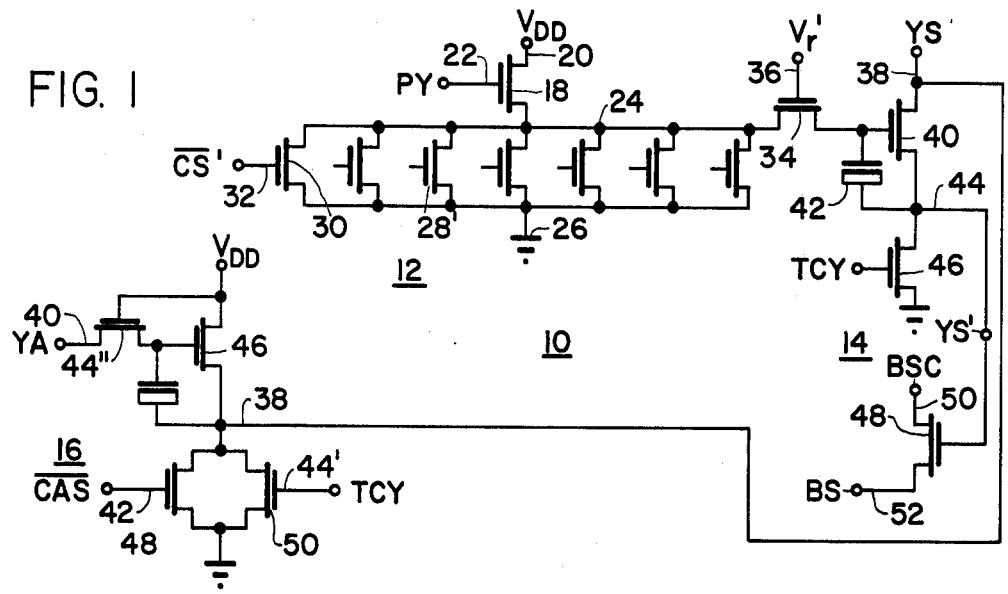
FIG. 1 is a schematic diagram of decoding circuitry according to a presently preferred embodiment of the invention.

The circuitry in FIG. 1 includes decoding and clock selection circuitry 10. Circuitry 10 includes NOR decode gate 12, column selection circuitry 14, and clock generator circuit 16. Decode gate 12 includes load MOSFET 18 coupled between $V_{DD}$ voltage supply conductor 20 and node 24 which is the output of NOR gate 12. MOSFET 18 has its gate connected to conductor 22, which has a percharge signal PY applied thereto. Decode switch MOSFETs 28, 28', etc. are coupled between node 24 and ground conductor 26.

Figure 2:
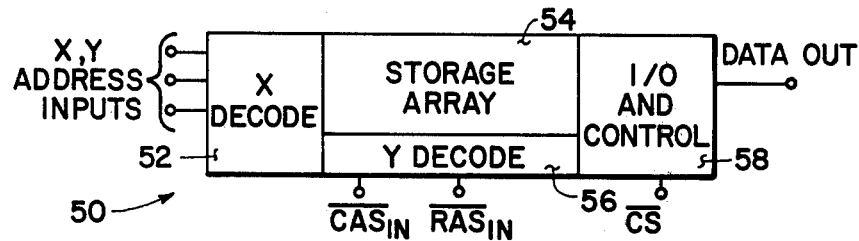
FIG. 2 is a block diagram of an MOS random access memory chip which utilizes the circuitry of FIG. 1.

In a presently preferred embodiment of the invention, circuitry 10 is utilized for decoding bit sense conductors of an MOS random access memory 50, shown in the block diagram of FIG. 2, having a storage array, decode circuitry and input and output and control circuitry on a single semiconductor chip. Normally, such semiconductor random access memory chips are organized as $2^N$ bits of memory storage cells arranged as $2^N$ words by one bit, (where N is the number of binary address inputs to the RAM chip) so that a plurality of such semiconductor chips may have their data output buses connected to a common data bus. Since the common data bus can only communicate with one chip at a time, a chip select input is provided for each semiconductor chip which allows the chip which is communicating with the common data bus to be selected all other semiconductor chips connected to the common data bus to be unselected. Typically, some or all of the X and Y address inputs for all chips connected to a particular common data bus may also be connected in common. Since system power dissipation is an important design criteria, it is very desirable that unselected chips dissipate less power than is required for a chip which is selected. Various circuit techniques have been utilized in the prior art, as discussed herein before to provide low power "standby" operation of unselected chips.

For reasons discussed hereinafter, MOSFET 30 coupled between node 24 and ground conductor 26 is provided in FIG. 1, and has its gate electrode connected to conductor 32, which has a signal designated $\overline{CS'}$ applied thereto. Each of the Y decode gates 12 in a presently preferred embodiment of the invention includes a MOSFET such as MOSFET 30. The signal $\overline{CS'}$ may be generated by an input buffer circuit which has as an input an externally applied chip select input for the semiconductor chip. Thus for an unselected semiconductor chip, MOSFET 30 discharges node 24, which has previously been precharged in response to precharge signal PY by means of load MOSFET 18. As explained hereinafter, this approach to providing internal decoding to an unselected random access memory chip results in substantial power savings.

Coupling MOSFET 34 is coupled between node 24 and the gate electrode of column selection MOSFET 40 and has its gate electrode coupled to a controlled power signal $V'_Y$. MOSFET 40 has its source connected to YS conductor 38, which has an internally generated clock signal applied thereto by clock generator circuit 16. The drain of MOSFET 40 is connected to $Y_S'$ conductor 44. Bootstrap capacitor 42 is connected between the gate and source of MOSFET 40.

Those skilled in the art will recognize that MOSFETs (metal oxide semiconductor field effect transistors), as implemented in typical integrated circuits, are bilateral devices, having a gate and a source and a drain. However, the source and drain are functionally interchangeable, and both in the description and in the claims, herein the terms are utilized merely to indicate interconnections, rather than function of a particular MOSFET terminal. For example, the terminal of MOSFET 34 which functions as a drain for one part of the circuit operation may function as a source for another part of the circuit operation. For a more complete description of the operation and physics of MOSFETs, see "Physics and Technology of Semiconductor Devices", by A. S. Grove, John Wiley & Sons, Inc., 1967. Those skilled in the art will also recognize that the acronym MOSFET is commonly used synonymously with the term IGFET (insulated gate field effect transistor), even though the gate may be polycrystalline silicon or some other conductive material rather than metal.

Still referring to FIG. 1 MOSFET 46 is connected between node 44 and ground conductor 26 and has its gate connected to a conductor having a signal TCY applied thereto. Node 44 is connected to the gate of MOSFET 48, which has its source connected to row bit sense conductor 52 and its drain connected to column bit sense conductor 50. In a presently preferred embodiment, there are a plurality of columns of storage cells each having a bit sense conductor 52 coupled to each of the storage cells. (Of course, it is immaterial whether a particular grouping of storage cells is referred to as a row or a column). Corresponding to each such column of storage cells there exists a NOR gate such as NOR gate 12 and column selection circuitry such as selection circuitry 14. A MOSFET corresponding to MOSFET 48 multiplexes the sensed signal from the selected row of the selected column of cells to column bit sense conductor 50, which drives an output circuit which in turn provides the data output signal on the data output conductor of the semiconductor chip 50.

The signal YS generated on conductor 38 is generated by clock generator circuit 16 in FIG. 1. A clocked load clock generator circuit 16 includes load MOSFET 46 connected between $V_{DD}$ and conductor 38, and two input switching MOSFETs 48 and 50 connected in parallel between node 38 and ground conductor 26. A signal designated $\overline{CAS}$ is applied to the gate of MOSFET 48. In a presently preferred embodiment of the invention, $\overline{CAS}$ (column address strobe) is an address control input applied to the semiconductor memory 50 chip for multiplexing the address inputs to a plurality of corresponding column address input buffers internal to the semiconductor chip. $Y_A$ is an internally generated signal derived from $\overline{CAS}$, delayed from and complementary thereto, to achieve reduced power dissipation of bootstrap NOR gate 16.

It can be seen that if MOSFET 30 were not provided, to disable NOR gate 12 during an unselected memory cycle, then the node 24 would be precharged toward $V_{DD}$, and MOSFET 40 would be on during an unselected cycle. Consequently, some other circuitry would be required to hold $Y_S$ at ground during an unselected memory cycle. Such other circuitry would require the dissipation of substantially more power during an unselected cycle than the scheme of providing MOSFETs such as MOSFET 30 to each of the column decode NOR gates such as NOR gate 12.

The block diagram of FIG. 2 illustrates the general structure of a RAM chip which incorporates a presently preferred embodiment of the invention as illustrated in the circuit schematic of FIG. 1. MOS random access memory chip 50 includes a storage array 54 arranged as rows and columns of storage cells. Rows of storage cells are selected by Y decode circuitry 52 in response to a plurality of address inputs which are multiplexed by means of a first address control input signal $\overline{RAS}$ to select one row of storage cells by means of X decode circuitry 52. Once the X selection input latches are loaded, a second column address control input $\overline{CAS}$ multiplexes the new address input configuration into Y address latches 56, which result in selection, by means of one of a plurality of row column decode circuits 12 (FIG. 1), the selection of one column of storage array 54.

The operation of the circuit of FIG. 1 is described with reference to the timing diagram of FIG. 3.

Figure 3:
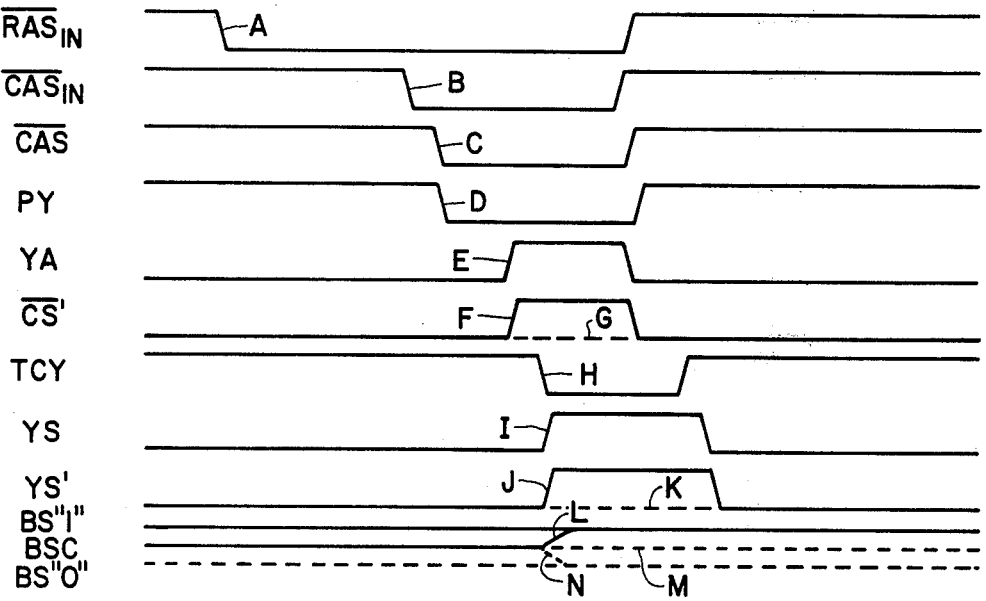
FIG. 3 is a timing diagram useful in describing the operation of the embodiment of the invention shown in FIGS. 1 and 2.

Referring to FIGS. 1-3, the first event in the operation of the RAM of FIGS. 1 and 2 is negative transition A of the $\overline{RAS}_{IN}$ input. The next step in the operation is negative transition B of $\overline{CAS}_{IN}$. In response to transition B, $\overline{CAS}$, which is derived from $\overline{CAS}_{IN}$ undergoes transition C, which generates a pulse delayed somewhat from $\overline{CAS}_{IN}$. In response to transition A, circuitry not shown causes $V'_Y$ to turn coupling MOSFET 34 on. Transition C causes MOSFET 48 to be turned off. PY is an internal clock derived from $\overline{CAS}_{IN}$, and when it undergoes transition D node 18 is charged toward $V_{DD}$ volts to a logical "1" level. Those skilled in the art will recognize that this is a necessary initial step in operation of a dynamic NOR gate. The next event is the transition E of $Y_A$ from a logical "0" to a logical "1". Since MOSFET 44 is on, since its gate is connected to $V_{DD}$, and MOSFET 50 is still on, and since TCY is still at a logical "1", the bootstrap capacitor C1 of bootstrap NOR gate 16 is charged up. If the RAM chip 50 is selected, that is, if a negative pulse of $\overline{RAS}_{IN}$ occurs and $\overline{CS}'$ remains low as indicated by dotted line G, then MOSFET 30 remains in the off condition. Then if decode gate 12 is selected by the proper combination of binary address inputs, normal decoding occurs. In this case, $Y_S$ undergoes transition I, and TCY undergoes transition H, turning MOSFET 46 off. Since node 24 is high for the selected decode gate, MOSFET 40 thereof will be on, and $Y_{S}'$, (node 44) will be charged up through MOSFET 40. This causes MOSFET 48 to be turned on, and the selected bit sense conductor 52 is coupled to the column bit sense conductor 50, which drives the data output circuit with a signal from the selected storage cell. $Y_S$ goes to $V_{DD}$ volts as soon as TCY undergoes transition H, since MOSFET 50 is then turned off and MOSFET 48 is already off.

However, if the RAM chip 50 is unselected, then $\overline{CS}'$ undergoes transition F, turning MOSFET 30 on. Thus, node 24 is discharged turing MOSFET 40 off. Then when $Y_S$ undergoes transition I, MOSFET 40 is off and node 44 is not coupled to $Y_S$, so $Y_{S}'$ remains low, as indicated by dotted line K. As a result, no signal is coupled from the selected cell through MOSFET 48, since MOSFET 48 is off, to bit sense conductor 50, and consequently the data output buffer (not shown) is not activated and its data output remains in an open, high impedance condition. For a more complete disclosure of an output buffer circuit which may be utilized as described above, see co-pending patent application SC-75775 "Low Output Disable Circuit for Random Access Memory" by Alan R. Bormann filed upon even date herewith and assigned to the present assignee.

What is claimed is:

1. In a MOS semiconductor random access memory chip including a plurality of address inputs, a chip selection input, and a plurality of sense lines, an address decode circuit coupled between first and second voltage conductors comprising:
  a dynamic NOR gate responsive to said plurality of address inputs having an output and including a first MOSFET means coupled between said output and said first voltage conductor for precharging said output, and a plurality of input MOSFETs responsive to said address inputs coupled between said output and said second voltage conductor for discharging said output if said dynamic NOR gate is not selected by said plurality of address inputs;

sense line selection circuit means coupled to said output for effecting selection of one of said sense lines in response to said dynamic NOR gate on the condition that said dynamic NOR gate is selected;

MOSFET means responsive to said chip selection input coupled between said output and said second voltage conductor for discharging said output on the condition that said MOS semiconductor random access memory chip is unselected to avoid selection of said one of said sense lines.

2. The address decode circuit as recited in claim 1 wherein said MOSFET means includes a MOSFET having its drain connected to said output, its gate responsive to said chip selection input, and its source connected to said second voltage conductor.

* * * * *